United States Patent
Kuo

(10) Patent No.: US 8,227,902 B2
(45) Date of Patent: Jul. 24, 2012

(54) STRUCTURES FOR PREVENTING CROSS-TALK BETWEEN THROUGH-SILICON VIAS AND INTEGRATED CIRCUITS

(75) Inventor: Chen-Cheng Kuo, Chu-Pei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 487 days.

(21) Appl. No.: 11/945,022

(22) Filed: Nov. 26, 2007

(65) Prior Publication Data

US 2009/0134500 A1    May 28, 2009

(51) Int. Cl.
*H01L 23/552* (2006.01)

(52) U.S. Cl. . 257/659; 257/621; 257/698; 257/E23.067; 257/E23.144; 257/E23.174

(58) Field of Classification Search .................. 257/620, 257/621, 659, 698, 773, 774, E23.067, E23.144, 257/E23.145, E23.174, E23.178
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,924,289 A * | 7/1999 | Bishop, II | |
| 5,998,292 A | 12/1999 | Black et al. | |
| 6,116,674 A * | 9/2000 | Allison et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,478,204 B2 * | 11/2002 | Lange et al. | |
| 6,538,333 B2 | 3/2003 | Kong | |
| 6,547,326 B1 * | 4/2003 | Walkinshaw et al. | |
| 6,563,181 B1 * | 5/2003 | Du et al. | 257/394 |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,761,388 B2 * | 7/2004 | Lein et al. | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |

(Continued)

FOREIGN PATENT DOCUMENTS

CN    1532924 A    9/2004

(Continued)

*Primary Examiner* — Matthew E Warren
(74) *Attorney, Agent, or Firm* — Slater & Matsil, L.L.P.

(57) ABSTRACT

A semiconductor chip includes a through-silicon via (TSV), a device region, and a cross-talk prevention ring encircling one of the device region and the TSV. The TSV is isolated from substantially all device regions comprising active devices by the cross-talk prevention ring.

19 Claims, 10 Drawing Sheets

U.S. PATENT DOCUMENTS

| | | | |
|---|---|---|---|
| 7,193,308 B2 | 3/2007 | Matsui | |
| 7,224,060 B2 | 5/2007 | Zhang et al. | |
| 7,240,814 B2 * | 7/2007 | Holmberg | |
| 7,262,495 B2 | 8/2007 | Chen et al. | |
| 7,297,574 B2 | 11/2007 | Thomas et al. | |
| 7,335,592 B2 | 2/2008 | Kim et al. | |
| 7,335,972 B2 | 2/2008 | Chanchani | |
| 7,355,273 B2 | 4/2008 | Jackson et al. | |
| 7,427,803 B2 * | 9/2008 | Chao et al. | 257/659 |
| 7,615,841 B2 | 11/2009 | Chen et al. | |
| 7,701,057 B1 * | 4/2010 | Rahman et al. | 257/750 |
| 2004/0080173 A1 * | 4/2004 | Niwa et al. | |
| 2004/0150070 A1 | 8/2004 | Okada et al. | |
| 2006/0141653 A1 | 6/2006 | Choi | |
| 2007/0075559 A1 * | 4/2007 | Sturt | |
| 2007/0119885 A1 * | 5/2007 | Miller et al. | |
| 2007/0152461 A1 * | 7/2007 | Joler et al. | |
| 2007/0246960 A1 * | 10/2007 | VandenHeuvel et al. | |
| 2008/0283959 A1 | 11/2008 | Chen et al. | |
| 2009/0072568 A1 * | 3/2009 | Luginbill et al. | |
| 2009/0127652 A1 * | 5/2009 | Ding et al. | 257/508 |
| 2009/0191708 A1 | 7/2009 | Kropewnicki et al. | |
| 2010/0133696 A1 | 6/2010 | Chen et al. | |

FOREIGN PATENT DOCUMENTS

| | | |
|---|---|---|
| CN | 1858909 A | 11/2006 |

* cited by examiner

STRUCTURES FOR PREVENTING CROSS-TALK BETWEEN THROUGH-SILICON VIAS AND INTEGRATED CIRCUITS

TECHNICAL FIELD

This invention relates generally to integrated circuits, and more particularly to structures and methods for reducing the cross-talks between through-silicon vias and integrated circuits in semiconductor chips.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and length of interconnections between devices as the number of devices increases. When the number and length of interconnections increase, both circuit RC delay and power consumption increase.

Among the efforts for resolving the above-discussed limitations, three-dimensional integrated circuit (3DIC) and stacked dies are commonly used. Through-silicon vias (TSV) are often used in 3DIC and stacked dies for connecting dies. In this case, TSVs are often used to connect the integrated circuits on a die to the backside of the die. In addition, TSVs are also used to provide short grounding paths for grounding the integrated circuits through the backside of the die, which is typically covered by a grounded metallic film.

FIG. 1 illustrates a stacked die structure with die 10 stacked on die 12, wherein dies 10 and 12 are electrically connected through solder balls 16. Die 12 includes TSVs 14, which extend all the way from the back surface (facing top) to the front surface (facing down) of die 12. TSVs 14 are further electrically connected to solder balls 18, which may be used to mount the stacked die structure onto a package substrate or a motherboard. Through TSVs 14, die 10 can not only be connected to die 12, but also to solder balls 18 directly.

TSVs 14 may be used as signal paths or grounding paths, and relatively great currents may be conducted through them. The currents flowing through TSVs 14 may thus have cross-talk with the integrated circuits in die 12. The cross-talk may become severe enough to cause noticeable performance degradation in die 12, particularly if the integrated circuits in die 12 include analog circuits, or the integrated circuits are operated at high frequencies. Solutions are thus needed to at least reduce the cross-talk.

SUMMARY OF THE INVENTION

In accordance with one aspect of the present invention, a semiconductor chip includes a through-silicon via (TSV) and a cross-talk prevention ring encircling one of a device region and the TSV. The TSV is isolated from substantially all device regions comprising active devices by the cross-talk prevention ring.

In accordance with another aspect of the present invention, a semiconductor chip includes a seal ring comprising four sides, each being adjacent to an edge of the semiconductor chip; and a cross-talk prevention ring encircled by the seal ring. The cross-talk prevention ring includes four sides, each being adjacent to one of the sides of the seal ring. The cross-talk prevention ring is preferably grounded. The semiconductor chip further includes a TSV in a region between the seal ring and the cross-talk prevention ring; and a device region encircled by the cross-talk prevention ring, wherein the device region comprises active devices.

In accordance with yet another aspect of the present invention, a semiconductor chip includes a seal ring comprising four sides, each being adjacent to an edge of the semiconductor chip; and a seal ring extension comprising a first end and a second end, each physically connected to a portion of the seal ring. The seal ring extension and the seal ring form a cross-talk prevention ring encircling a first region of the semiconductor die, wherein the first region is substantially free from active devices. The semiconductor chip further includes a TSV in the first region; and a second region outside the cross-talk prevention ring, wherein the second region comprises active devices.

An advantageous feature of the present invention includes reduced cross-talk between the cross-talk prevention ring and the integrated circuit.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
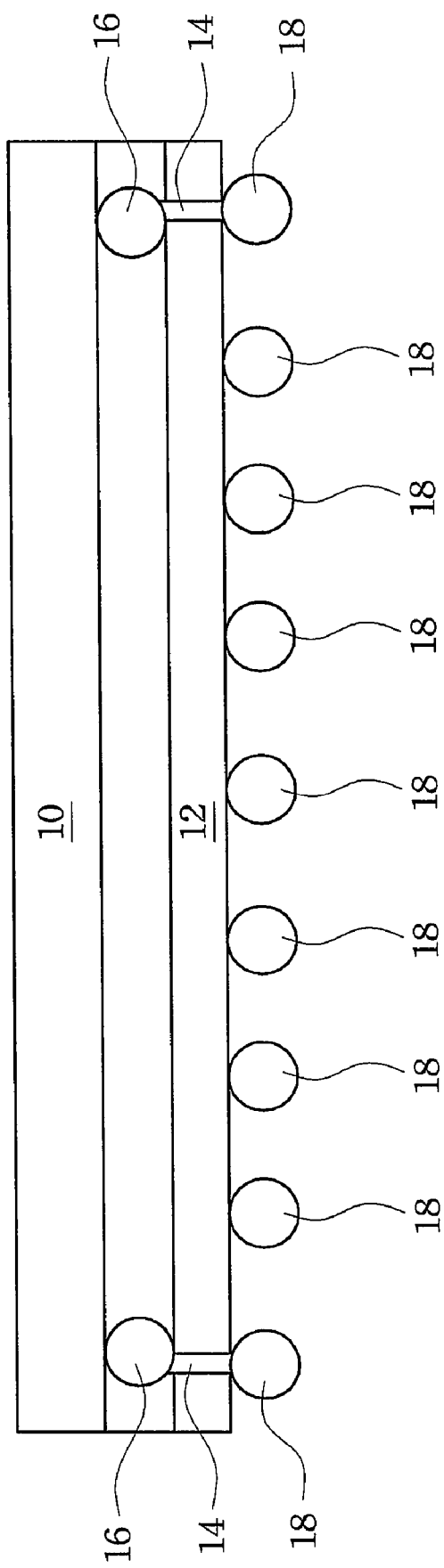
FIG. 1 illustrates a conventional stacked-die structure including through-silicon vias.
Figure 2A:
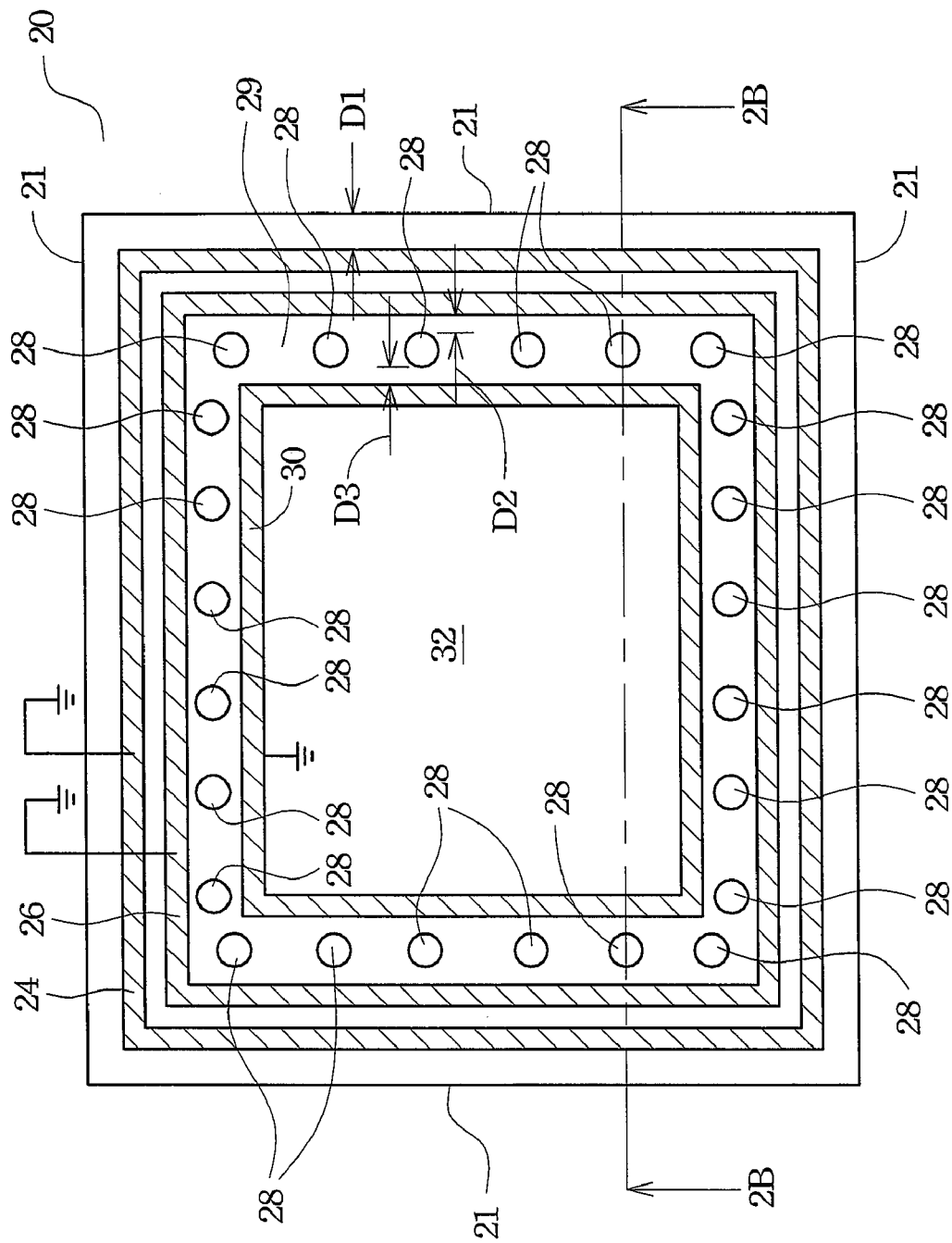
FIGS. 2A and 2B are a top view and a cross-sectional view of an embodiment of the present invention, respectively, wherein through-silicon vias are formed between a seal ring and a cross-talk prevention ring.

FIG. 2A illustrates a top view of a first embodiment of the present invention, which includes semiconductor chip (also referred to as die in the packaging art) 20. Seal rings 24 and 26 are formed close to edges 21 of chip 20. Seal rings 24 and 26 are preferably grounded. As is known in the art, seal ring 26 is sometimes referred to as a main seal ring, while seal ring 24 is referred to as a sacrificial seal ring. Sacrificial seal ring 24 is optional.

Through-silicon vias 28 are formed in an inner region encircled by seal ring 26. In an embodiment, TSVs 28 are located close to seal ring 26, and may be formed as a line along each side of seal ring 26. Correspondingly, TSVs 28 may have a ring-like structure. In the preferred embodiment, the distance D2 between TSVs 28 and the respective side of seal ring 24 is small. One skilled in the art will realize that the dimensions recited throughout the description are merely examples, and may be scaled with the down-scaling of integrated circuits.

Cross-talk prevention ring 30 is formed in inner sides of TSVs 28, and is preferably signal grounded. Throughout the description, when a conductive feature, such as cross-talk prevention ring 30, is referred to as signal grounded, the conductive feature is connected either to the ground, or a (high frequency) shield group, wherein signals (particularly high frequency signals) in the shield group are filtered. In either case, when signal grounded, the conductive feature is substantially free of noise, particularly high frequency noise. A signal ground is therefore defined as the ground or the shielded group that is substantially noise free. Cross-talk prevention ring 30 is preferably formed close to TSVs 28 and seal ring 24, so that the chip area used by the cross-talk prevention structures is minimized. Similarly, the distance D3 between TSVs 28 and the respective sides of cross-talk prevention ring 30 is preferably small. The inner region 32 enclosed by cross-talk prevention ring 30 is a device region, in which active devices such as transistors (symbolized by transistor 31 in FIG. 2B) are formed. Device region 32 may include analog circuit region $32_1$, digital circuit region $32_2$, and combinations thereof.

In the preferred embodiment, the region 29 between cross-talk prevention ring 30 and seal ring 26 is free from active devices. Alternatively, some low frequency digital devices, which are less prone to the cross-talk, are formed in region 29, while analog devices and/or high frequency devices are not in region 29.

Figure 2B:
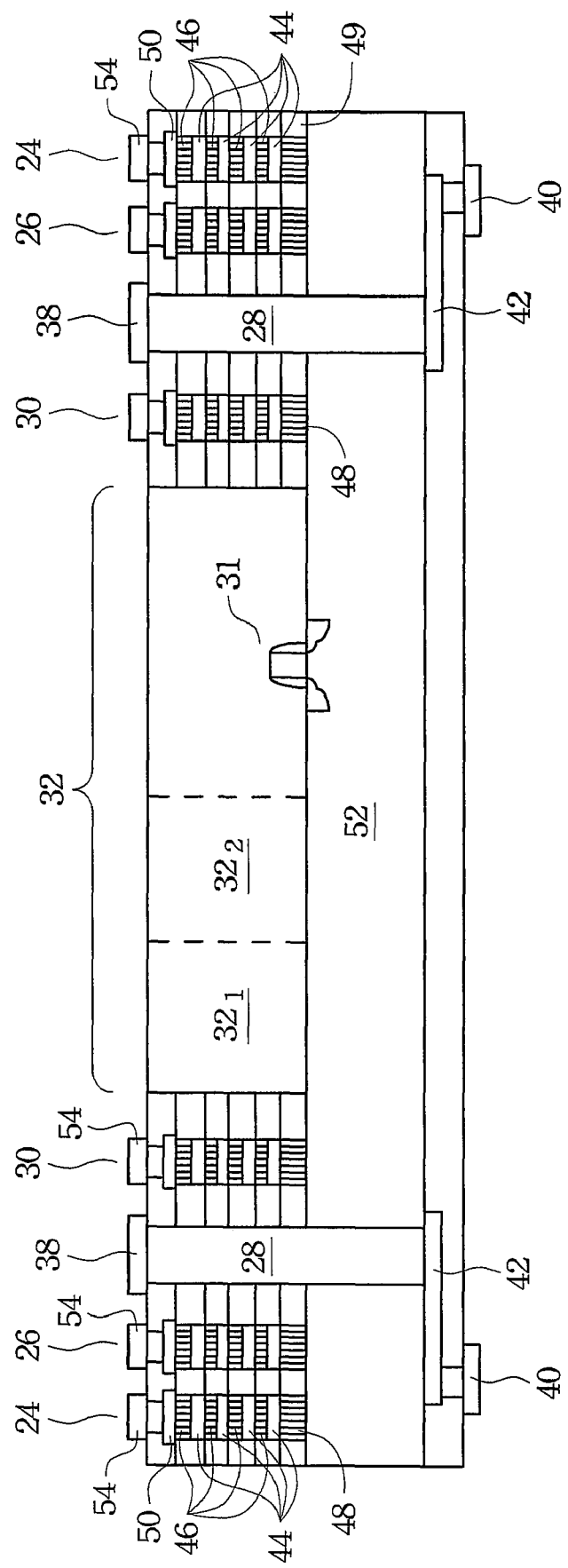

FIG. 2B illustrates a cross-sectional view of the structure shown in FIG. 2A, wherein the cross-sectional view is taken along line 2B-2B. The cross-sectional view illustrates that TSVs 28 extend from the top surface of chip 20 to the back surface. Bond pads 38 are formed on one side of chip 20 and are electrically connected to TSVs 28. Bond pads 40 may be connected to TSV 28 through redistribution lines 42, which are preferably formed of copper, aluminum, and the like. Redistribution lines (not shown) may also be formed and connected to TSVs 28 and bond pads 38, so that bond pads 38 may be horizontally spaced apart from the respective TSVs 28.

Seal rings 24, 26, and cross-talk prevention ring 30 may be formed simultaneously, each including a plurality of interconnected metal lines 44 and vias 46. Each of the illustrated metal lines 44 and vias 46 may form a ring encircling device region 32. Preferably, contact plugs 48, which are also preferably rings, are formed in inter-layer dielectric (ILD) 49, which is over semiconductor substrate 52. Contact plugs 48 are electrically connected to the respective overlying metal lines 44 in the bottom metallization layer. Also, aluminum pad 50 may be formed as a ring. Seal rings 24, 26, and cross-talk prevention ring 30 may each be signal grounded through bond pads 54. Alternatively, metal lines may be formed inside metallization layers to electrically connect seal rings 24, 26, and cross-talk prevention ring 30 to other grounding paths. Cross-talk prevention ring 30 thus isolates TSVs 28 and device region 32 from each other, so that the cross-talks between TSVs 28 and device region 32 is reduced.

In an embodiment, substantially all TSVs in chip 20 are isolated from device region 32 by cross-talk prevention ring 30. In alternative embodiments, only a portion of TSVs that are expected to carry either relatively high currents, or signals with high frequencies, are isolated from device region 32 by cross-talk prevention ring 30, while remaining TSVs may be formed in device region 32.

Figure 3:
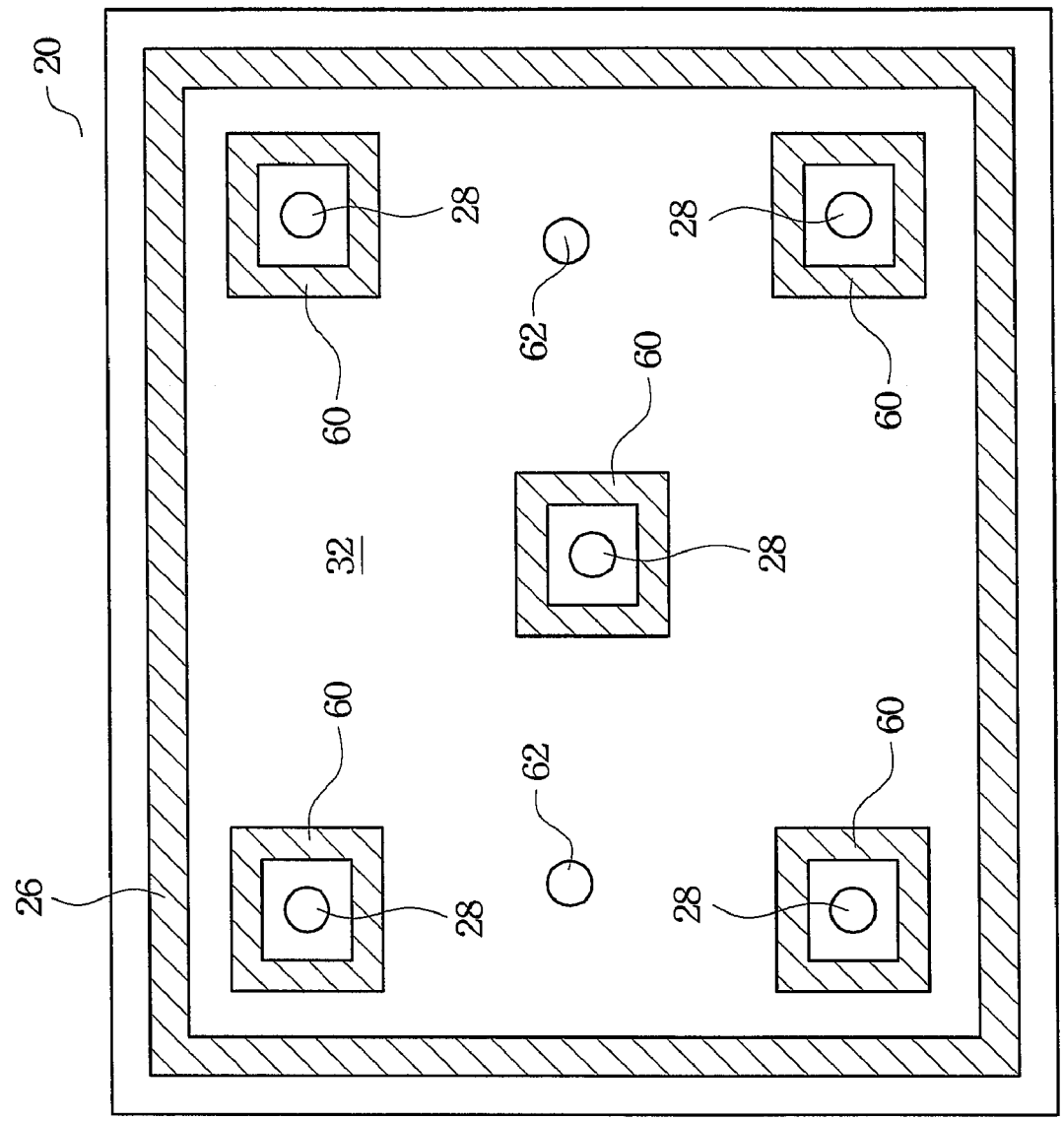
FIGS. 3 through 5B are alternative embodiments of the present invention, wherein cross-talk prevention rings have different shapes.

FIG. 3 illustrates an alternative embodiment of the present invention including a plurality of TSVs 28 and a plurality of cross-talk prevention rings 60. Each of the TSVs 28 may be encircled by one of the cross-talk prevention rings 60, which are preferably formed simultaneously with seal rings 24 and 26. Similarly, cross-talk prevention rings 60 are also formed of interconnected metal lines, vias, contact plugs, aluminum pads, and the like. An advantageous feature of this embodiment is that TSVs 28 may be embedded inside device region 32. In addition, if some of the TSVs 62 are not expected to carry high currents and/or carry currents with high frequencies, these TSVs 62 do not necessarily need to be encircled by cross-talk prevention rings 60.

Figure 4:
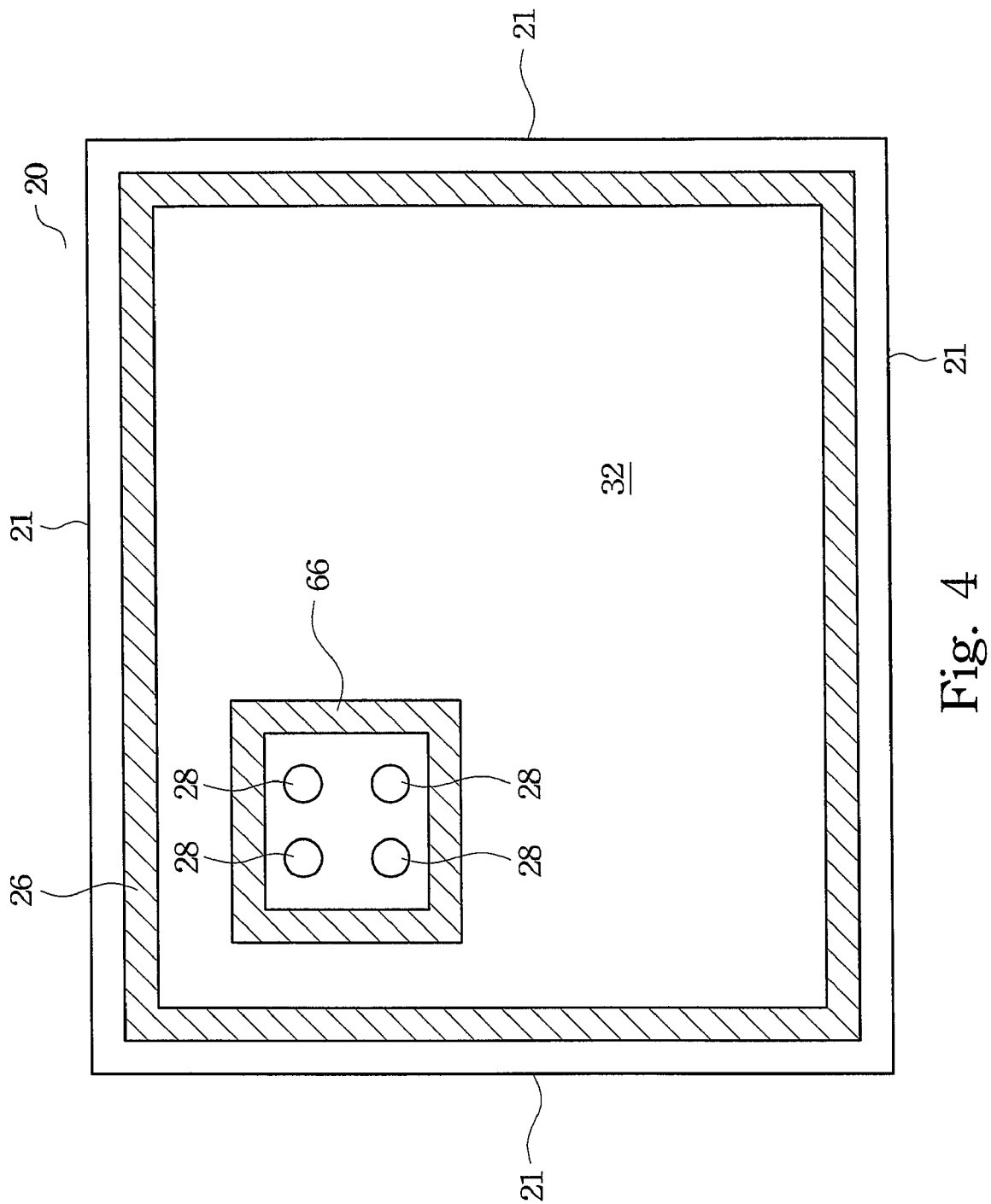

FIG. 4 illustrates a further embodiment, wherein TSVs 28 are enclosed by cross-talk prevention ring 66, which is signal grounded. However, not all sides of cross-talk prevention ring 66 are adjacent to a respective edge 21 of semiconductor chip 20. TSVs 28 and cross-talk prevention ring 66 may thus be formed at locations other than edge regions of semiconductor chip 20.

Figure 5A:
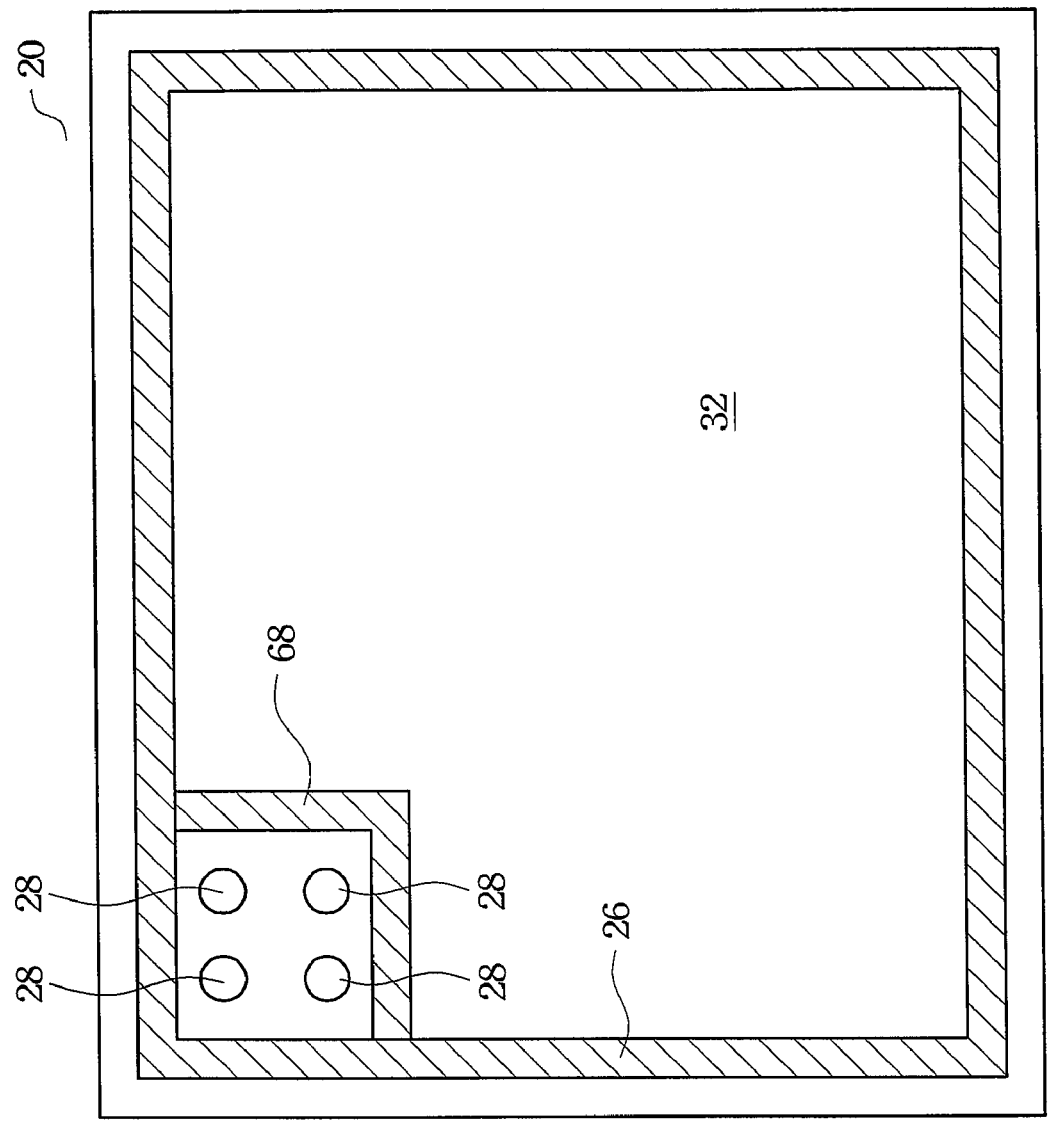
Figure 5B:
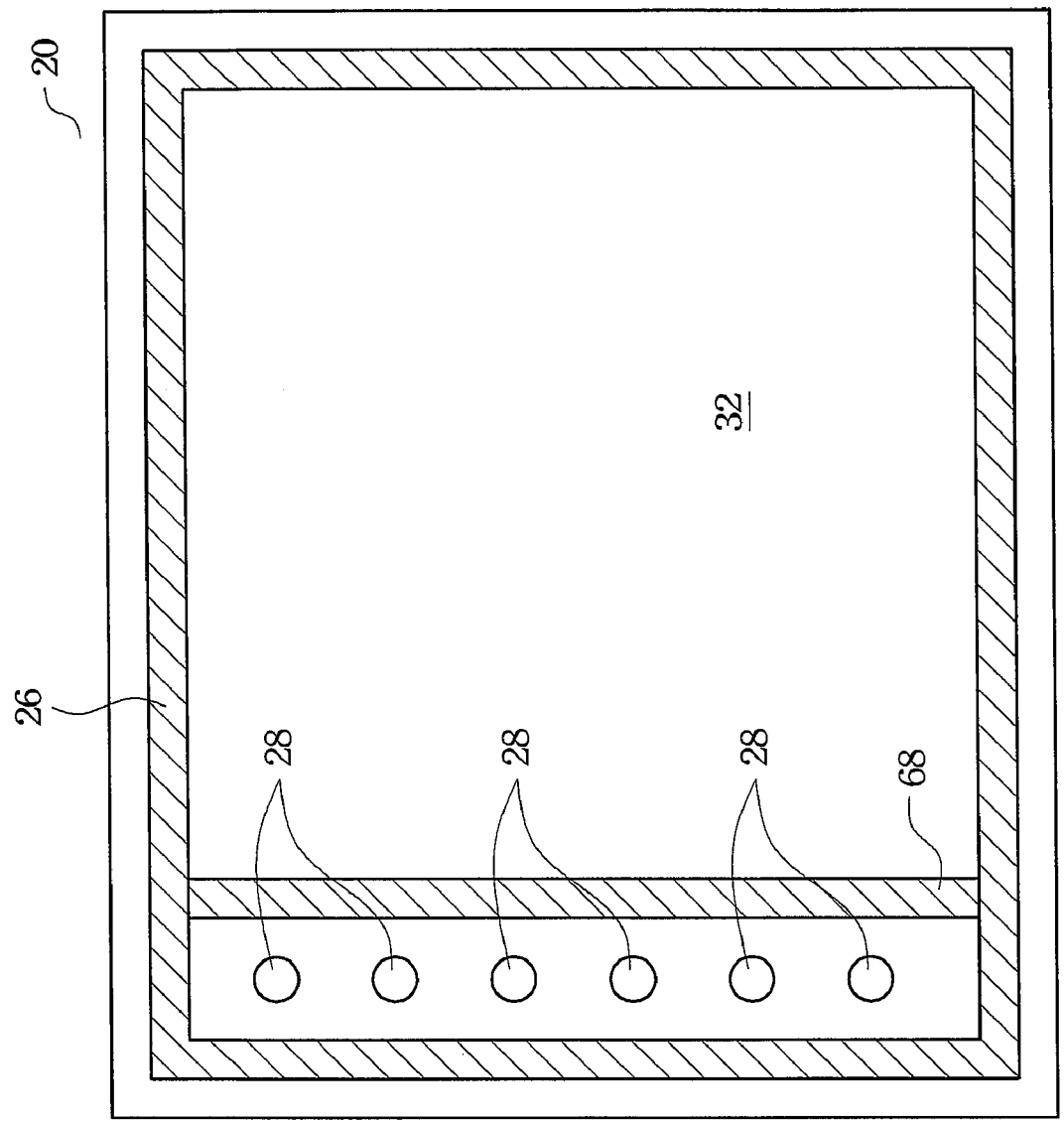

In FIGS. 5A and 5B, the cross-talk prevention structures of TSVs 28 each include seal ring extension 68 and a portion of the rectangular-shaped seal ring 26. Seal ring extension 68 is preferably formed simultaneously, and thus has a similar layered structure, as seal ring 26. This cross-talk prevention structure may also isolate TSVs 28 from device region 32. In FIG. 5A, the cross-talk prevention structure is formed close to a corner of seal ring 26. In FIG. 5B, all TSVs 28 are formed close to one edge of chip 20, and seal ring extension 68 is formed as a straight line with two ends, each physically connected to a portion of seal ring 26.

Figure 6:
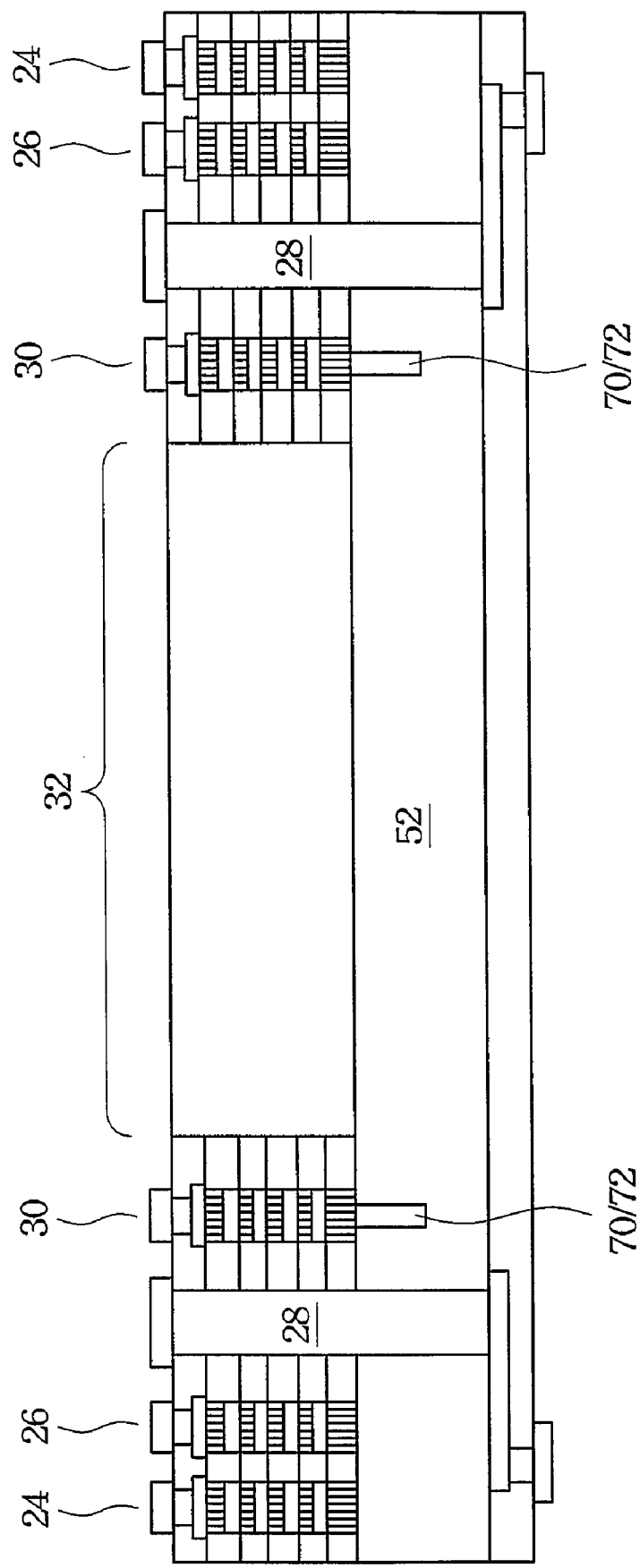
FIG. 6 illustrates a cross-talk prevention ring comprising a portion in a semiconductor substrate.

It is realized that the structures shown in FIGS. 2 through 5B may be combined to provide better cross-talk preventing ability, and provide flexibility to the design. In addition, cross-talk prevention rings may extend into the semiconductor substrates. In FIG. 6, conductive ring 70, preferably formed of metal, is formed in semiconductor substrate 52. Conductive ring 70 is preferably a metal ring, which may be formed of tungsten, aluminum, copper, and the like. Alternatively, conductive ring 70 is a well region, preferably heavily doped by implanting a p-type or n-type impurity. In the preferred embodiment, conductive ring 70 adjoins cross-talk prevention ring 30, and hence is also grounded. Conductive ring 70 acts as a sink for currents generated by the cross-talk.

Alternatively, instead of forming conductive ring 70, a dielectric ring 72 is formed in semiconductor substrate 52. Dielectric ring 72 acts as a barrier for the cross-talk currents generated in substrate 52. The formation of conductive ring 70 or dielectric ring 72 may include etching semiconductor substrate 52 to form a trench ring, filling the trench ring with a conductive material or a dielectric material, and performing a chemical mechanical polish to remove excess conductive/dielectric material. The conductive ring 70 or dielectric ring 72 may also be formed under cross-talk prevention rings 60 and 66 as shown in FIGS. 3 and 4, respectively, and under seal ring extensions 68 as shown in FIGS. 5A and 5B.

Figure 7A:
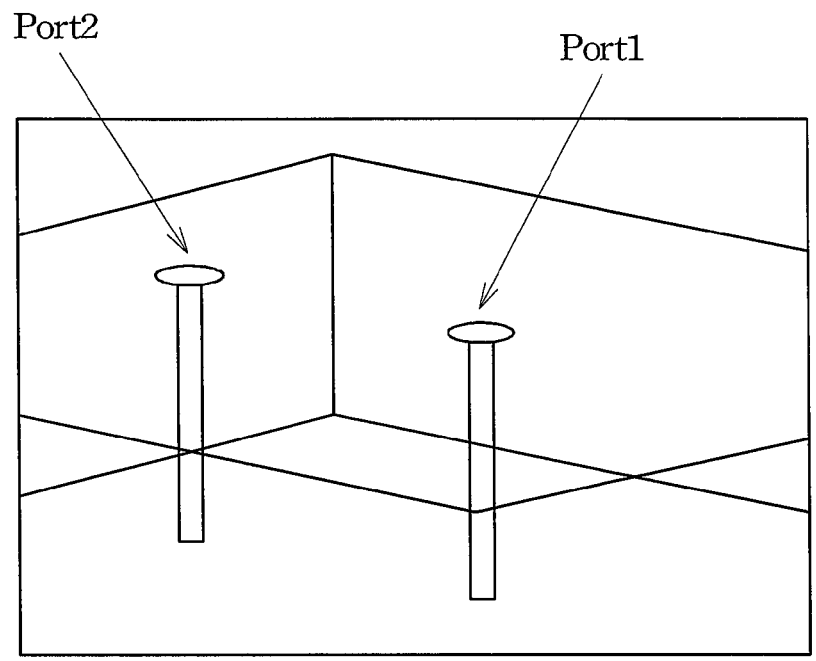
FIGS. 7A and 7B are structures for performing simulations.
Figure 7B:
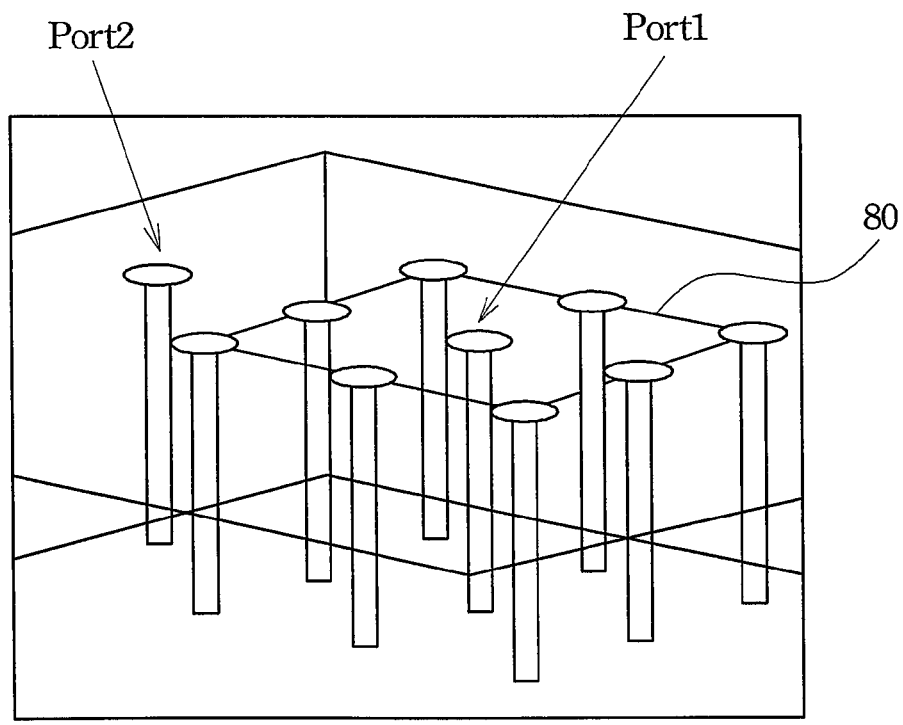
Figure 8:
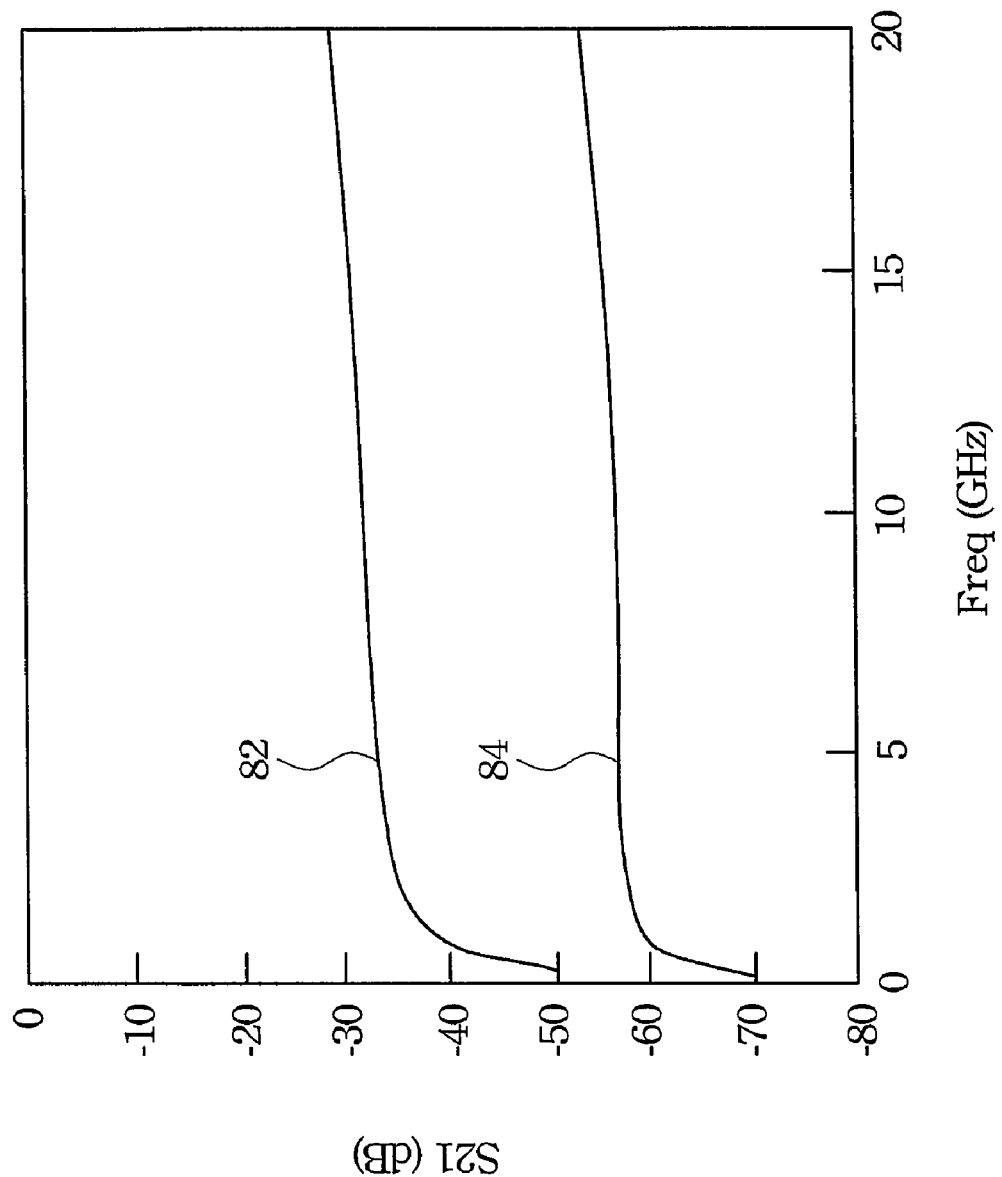
FIG. 8 illustrates the simulation results, wherein the scattering parameter is illustrated as a function of frequency.

By forming the cross-talk prevention structure, the cross-talk is significantly reduced. FIG. 7B illustrates a structure for performing a simulation, wherein port 1 is a signal input port, and port 2 is a signal output port. The grounded cross-talk prevention ring 80 encircles port 1. The simulation results revealed that the scattering parameter S21, which is expressed as $20 \log(V_{port\_2}/V_{port\_1})$, is significant reduced than if cross-talk prevention ring 80 does not exist, which structure is shown in FIG. 7A. The simulation results are shown in FIG. 8, wherein the scattering parameter S21 is illustrated as a function of frequency. Line 82 is the simulation result of the structure shown in FIG. 7A, and line 84 is the simulation result of the structure shown in FIG. 7B. It may be concluded that the cross-talk are more severe at higher frequencies. However, regardless of the frequencies, the cross-talk prevention structure may reduce the cross-talk by more than about 20 decibels.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor chip comprising:
    a through-substrate via (TSV) extending through a semiconductor substrate, the TSV being a signal-carrying TSV;
    a device region; and
    a cross-talk prevention ring comprising a first portion in a metallization layer over the semiconductor substrate, the first portion encircling the device region, wherein the TSV is isolated from substantially all device regions comprising active devices by the cross-talk prevention ring, the cross-talk prevention ring comprising a conductive material.

2. The semiconductor chip of claim 1 further comprising a seal ring adjacent to edges of the semiconductor chip, wherein the seal ring encircles the cross-talk prevention ring, and wherein the TSV is between the seal ring and the cross-talk prevention ring.

3. The semiconductor chip of claim 2 further comprising a sacrificial ring between the seal ring and the edges of the semiconductor chip.

4. The semiconductor chip of claim 2 further comprising a plurality of TSVs between the seal ring and the cross-talk prevention ring.

5. The semiconductor chip of claim 1, wherein the cross-talk prevention ring encircles an additional TSV.

6. The semiconductor chip of claim 1 further comprising a seal ring adjacent to edges of the semiconductor chip, wherein the cross-talk prevention ring comprises a seal ring extension and a portion of the seal ring.

7. The semiconductor chip of claim 6, wherein the cross-talk prevention ring comprises a corner portion of the seal ring.

8. The semiconductor chip of claim 6, wherein the cross-talk prevention ring comprises an edge and two corner portions of the seal ring.

9. The semiconductor chip of claim 1, wherein the cross-talk prevention ring comprises a second portion in the semiconductor substrate, and wherein the second portion is conductive and is electrically connected to the first portion.

10. The semiconductor chip of claim 1, wherein the cross-talk prevention ring comprises a second portion in the semiconductor substrate, and wherein the second portion comprises a dielectric material.

11. The semiconductor chip of claim 1, wherein the cross-talk prevention ring is grounded.

12. The semiconductor chip of claim 1 further comprising a plurality of TSVs, each encircled by an additional grounded cross-talk prevention ring.

13. The semiconductor chip of claim 1, further comprising a seal ring comprising four sides, each being adjacent to an edge of the semiconductor chip, wherein the cross-talk prevention ring is encircled by the seal ring, wherein the cross-talk prevention ring comprises four sides, each being adjacent to one of the sides of the seal ring, wherein the cross-talk prevention ring is grounded, and wherein the TSV is located in a region between the seal ring and the cross-talk prevention ring.

14. The semiconductor chip of claim 13, wherein the region between the seal ring and the cross-talk prevention ring is substantially free from active devices.

15. The semiconductor chip of claim 13 further comprising a plurality of TSVs distributed in the region between the seal ring and the cross-talk prevention ring.

16. The semiconductor chip of claim 13, wherein the cross-talk prevention ring comprises a second portion in the semiconductor substrate, and wherein the second portion is conductive and is electrically connected to the first portion.

17. The semiconductor chip of claim 13, wherein the cross-talk prevention ring comprises a second portion in the semiconductor substrate, and wherein the second portion comprises a dielectric material.

18. The semiconductor chip of claim 1, further comprising
    a seal ring comprising four sides, each being adjacent to an edge of the semiconductor chip; and
    a seal ring extension comprising a first end and a second end, each physically connected to a portion of the seal ring, wherein the seal ring extension and the seal ring form the cross-talk prevention ring encircling a first region of the semiconductor die, and wherein the first region is substantially free from active devices, the TSV being located in the first region, a second region outside the cross-talk prevention ring comprising active devices.

19. The semiconductor chip of claim 18, wherein the first region further comprises additional TSVs.

* * * * *